United States Patent
Lee et al.

(10) Patent No.: US 10,204,919 B2
(45) Date of Patent: Feb. 12, 2019

(54) VERTICAL MEMORY DEVICE

(71) Applicant: SAMSUNG ELECTRONICS CO., LTD., Suwon-si, Gyeonggi-do (KR)

(72) Inventors: Byoung Il Lee, Seoul (KR); Joong Shik Shin, Yongin-si (KR); Dong Seog Eun, Seongnam-si (KR); Kyung Jun Shin, Seoul (KR); Hyun Kook Lee, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 82 days.

(21) Appl. No.: 15/252,740

(22) Filed: Aug. 31, 2016

(65) Prior Publication Data

US 2017/0170191 A1 Jun. 15, 2017

(30) Foreign Application Priority Data

Dec. 11, 2015 (KR) ........................ 10-2015-0177334

(51) Int. Cl.
| | |
|---|---|
| H01L 27/115 | (2017.01) |
| H01L 27/11582 | (2017.01) |
| H01L 27/02 | (2006.01) |
| H01L 27/11565 | (2017.01) |

(52) U.S. Cl.
CPC .... *H01L 27/11582* (2013.01); *H01L 27/0207* (2013.01); *H01L 27/11565* (2013.01)

(58) Field of Classification Search
None
See application file for complete search history.

(56) References Cited

U.S. PATENT DOCUMENTS

| | | |
|---|---|---|
| 9,087,790 B2 | 7/2015 | Oh et al. |
| 2013/0028027 A1 | 1/2013 | Kim et al. |
| 2014/0038400 A1 | 2/2014 | Park et al. |
| 2014/0197481 A1 | 7/2014 | Hwang et al. |
| 2015/0137205 A1 | 5/2015 | Kim et al. |
| 2015/0137216 A1 | 5/2015 | Lee et al. |
| 2015/0214242 A1 | 7/2015 | Lee |

(Continued)

FOREIGN PATENT DOCUMENTS

| | | |
|---|---|---|
| KR | 1020120026273 | 3/2012 |
| KR | 1020140093044 | 7/2014 |

(Continued)

*Primary Examiner* — Abul Kalam
(74) *Attorney, Agent, or Firm* — F. Chau & Associates, LLC

(57) ABSTRACT

A vertical memory device is provided as follows. A substrate has a cell array region and a connection region adjacent to the cell array region. A first gate stack includes gate electrode layers spaced apart from each other in a first direction perpendicular to the substrate. The gate electrode layers extends from the cell array region to the connection region in a second direction perpendicular to the first direction to form a first stepped structure on the connection region. The first stepped structure includes a first gate electrode layer and a second gate electrode layer sequentially stacked. The second gate electrode layer includes a first region having the same length as a length of the first gate electrode layer and a second region having a shorter length than the length of the first gate electrode layer.

19 Claims, 19 Drawing Sheets

(56) References Cited

U.S. PATENT DOCUMENTS

2015/0228623 A1* 8/2015 Oh .................... H01L 27/11575
    257/4
2015/0255385 A1   9/2015 Lee et al.
2016/0093513 A1* 3/2016 Hong ................ H01L 21/32139
    438/637

FOREIGN PATENT DOCUMENTS

| KR | 1020150057147 | 5/2015 |
| KR | 1020150069423 | 6/2015 |
| KR | 1020150089138 | 8/2015 |
| KR | 1020150095397 | 8/2015 |

* cited by examiner

US 10,204,919 B2

VERTICAL MEMORY DEVICE

CROSS-REFERENCE TO RELATED APPLICATION

This application claims priority under 35 U.S.C. 119 to Korean Patent Application No. 10-2015-0177334, filed on Dec. 11, 2015 in the Korean Intellectual Property Office, the disclosure of which is incorporated by reference herein in its entirety.

TECHNICAL FIELD

The present inventive concept relates to a vertical memory device.

DISCUSSION OF RELATED ART

Electronics are increasingly required to process high-capacity data while being gradually reduced in volume. Accordingly, there is a need for an increase in a degree of integration of semiconductor memory elements used for such electronics. As one method of increasing a degree of integration in semiconductor memory elements, a vertical memory device having a vertical transistor structure in lieu of a conventional planar transistor structure has been proposed.

SUMMARY

According to an exemplary embodiment of the present inventive concept, a vertical memory device is provided as follows. A substrate has a cell array region and a connection region adjacent to the cell array region. A first gate stack includes a plurality of gate electrode layers spaced apart from each other in a first direction perpendicular to the substrate. The plurality of gate electrode layers extends from the cell array region to the connection region in a second direction perpendicular to the first direction to form a first stepped structure on the connection region. The first stepped structure includes a first gate electrode layer and a second gate electrode layer sequentially stacked. The second gate electrode layer includes a first region having the same length as a length of the first gate electrode layer and a second region having a shorter length than the length of the first gate electrode layer in the second direction.

According to an exemplary embodiment of the present inventive concept, a vertical memory device is provided as follows. A plurality of gate electrode layers is stacked on a cell array region of a substrate and a plurality of channel columns passing through the plurality of gate electrode layers in a first direction perpendicular to an upper surface of the substrate. A stepped structure is disposed on a connection region of the substrate, wherein the stepped structure is formed by the plurality of gate electrode layers extending from the cell array region to the connection region in a second direction perpendicular to the first direction. The stepped structure includes a first gate electrode layer and a second gate electrode layer sequentially stacked. The first gate electrode layer and the second gate electrode layer extend to have the same length in the second direction.

According to an exemplary embodiment of the present inventive concept, a vertical memory device is provided as follows. A substrate has a cell array region and a connection region adjacent to the cell array region. A gate stack includes a plurality of gate electrode layers spaced apart from each other in a direction perpendicular to the substrate and extending from the cell array region to the connection region, the plurality of gate electrode layers forming a stepped structure on the connection region. A height of the gate stack on the cell array region in the direction perpendicular to the substrate is from 3.5 µm to 10 µm, and an upper surface of the substrate and a virtual line connecting an end of a top gate electrode layer among the plurality of gate electrode layers to an end of a bottom gate electrode layer thereamong form an angle from about 7 degrees to about 45 degrees.

BRIEF DESCRIPTION OF DRAWINGS

These and other features of the inventive concept will become more apparent by describing in detail exemplary embodiments thereof with reference to the accompanying drawings of which.

Figure 1:
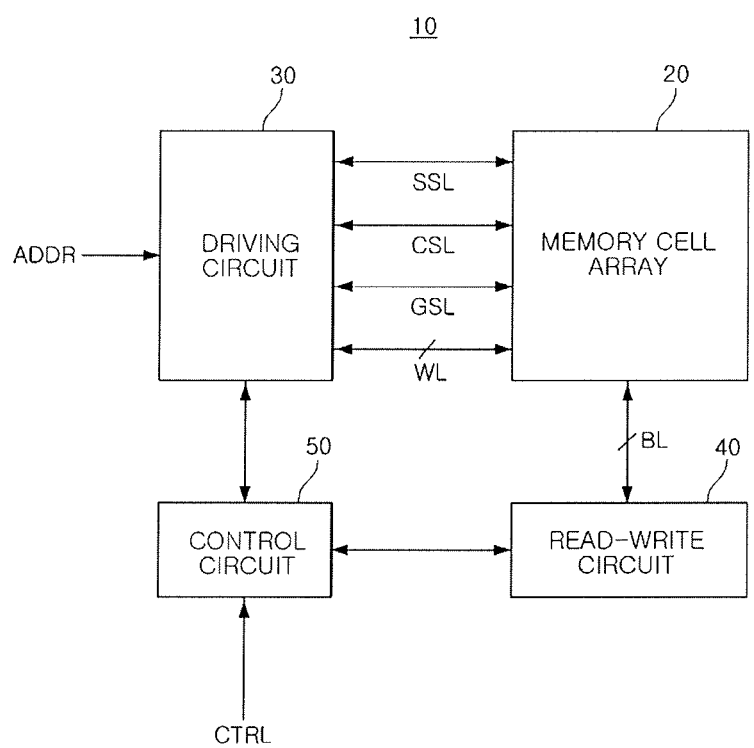
FIG. 1 is a schematic block diagram of a vertical memory device according to an example embodiment of the present inventive concept.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Sizes and thicknesses of constituent members shown in the accompanying drawings are arbitrarily given for better understanding and ease of description. In the drawings, the thicknesses and/or areas of layers, films, regions, etc., are exaggerated for clarity.

DETAILED DESCRIPTION OF EXEMPLARY EMBODIMENTS

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a schematic block diagram of a vertical memory device according to an example embodiment of the present inventive concept.

Referring to FIG. 1, a vertical memory device 10 according to an example embodiment may include a memory cell array 20, a driving circuit 30, a read/write circuit 40, and a control circuit 50. As an example, the vertical memory device 10 according to an example embodiment may be a non-volatile memory device.

The memory cell array 20 may include a plurality of memory cells, and the plurality of memory cells may be arranged in a plurality of rows and columns. The plurality of memory cells included in the memory cell array 20 may be connected to the driving circuit 30 through word lines WL, common source lines CSL, string select lines SSL, ground select lines GSL, and the like, and may be connected to the read/write circuit 40 through bit lines BL. In an example embodiment, a plurality of memory cells arranged in an identical row may be connected to an identical word line WL, and a plurality of memory cells arranged in an identical column may be connected to an identical bit line BL.

The plurality of memory cells included in the memory cell array 20 may be divided into a plurality of memory blocks. Each of the memory blocks may include a plurality of word lines WL, a plurality of string select lines SSL, a plurality of ground select lines GSL, a plurality of bit lines BL, and at least one common source line CSL.

The driving circuit 30 and the read/write circuit 40 may be operated by the control circuit 50. According to an example embodiment, the driving circuit 30 may receive an address ADDR from an external source, and may decode the received address ADDR to select at least one word line WL, common source lines CSL, string select lines SSL, and ground select lines GSL connected to a memory cell array.

The driving circuit 30 may include a driving circuit for each of the word lines WL, the string select lines SSL, and the common source lines CSL.

The read/write circuit 40 may select at least one bit line BL connected to the memory cell array 20 in response to a command received from the control circuit 50. The read/write circuit 40 may read data stored in a memory cell connected to the selected at least one bit line BL, or may write data to the memory cell connected to the selected at least one bit line BL. The read/write circuit 40 may include circuits such as a page buffer, an input/output (I/O) buffer, a data latch, and the like to perform the above operations.

The control circuit 50 may control the operations of the driving circuit 30 and the read/write circuit 40 in response to a control signal CTRL transmitted from an external source. In the case of reading data stored in the memory cell array 20, the control circuit 50 may control the operations of the driving circuit 30 to supply a voltage for a data reading operation to a word line WL in which data required to be read is stored. When a voltage for a data reading operation is supplied to a certain word line WL, the control circuit 50 may control the read/write circuit 40 to read data stored in a memory cell connected to the word line WL to which the voltage for a data reading operation is supplied.

In contrast, in the case of writing data to the memory cell array 20, the control circuit 50 may control the operations of the driving circuit 30 to supply a voltage for a data writing operation to a word line WL to which data is required to be written. When a voltage for a data writing operation is supplied to a certain word line WL, the control circuit 50 may control the read/write circuit 40 to write data to a memory cell connected to the word line WL to which the voltage for a data writing operation is supplied.

Figure 2:
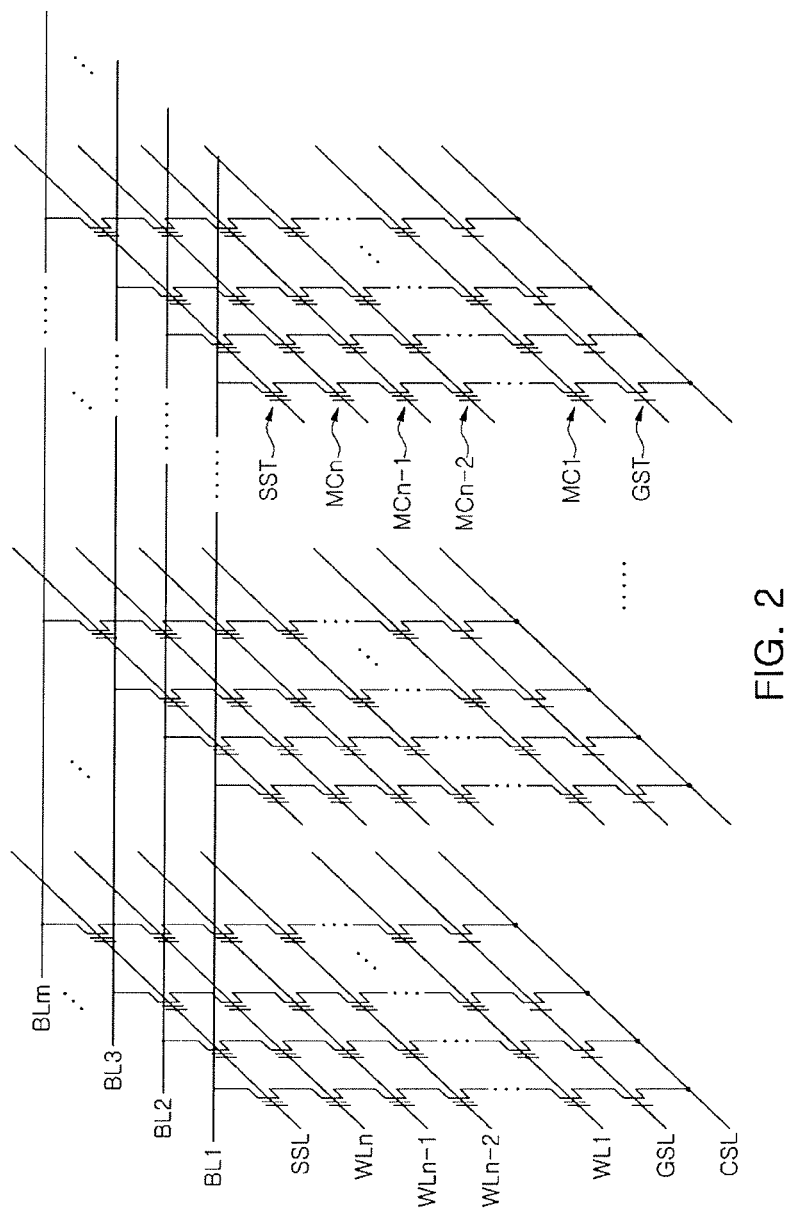
FIG. 2 is a circuit diagram of a memory cell array of a vertical memory device according to an example embodiment of the present inventive concept.

FIG. 2 is an equivalent circuit diagram of a memory cell array of a vertical memory device according to an example embodiment of the present inventive concept. FIG. 2 is the equivalent circuit diagram illustrating a 3D structure of the memory cell array.

Referring to FIG. 2, the memory cell array 20 of FIG. 1 may include a plurality of strings. For example, each string may include an n number of memory cell devices MC1 to MCn connected to each other in series, and a ground select transistor GST and a string select transistor SST connected to both ends of the respective memory cell devices MC1 to MCn in series, respectively.

The n number of memory cell devices MC1 to MCn connected to each other in series may be connected to word lines WL1 to WLn selecting at least a portion of the memory cell devices MC1 to MCn, respectively.

A gate terminal of the ground select transistor GST may be connected to a ground select line GSL, and a source terminal of the ground select transistor GST may be connected to a common source line CSL. Meanwhile, a gate terminal of the string select transistor SST may be connected to a string select line SSL, and a source terminal of the string select transistor SST may be connected to a drain line of the memory cell device MCn. For the convenience of a description, FIG. 2 illustrates a structure in which a single ground select transistor GST and a single string select transistor SST are connected to the n number of memory cell devices MC1 to MCn connected to each other in series. The present inventive concept is not limited thereto. For example, a plurality of ground select transistors GST or a plurality of string select transistors SST may also be connected to the n number of memory cell devices MC1 to MCn.

A drain terminal of the string select transistor SST may be connected to bit lines BL1 to BLm. When a signal is applied to the gate terminal of the string select transistor SST through the string select line SSL, a signal applied through the bit lines BL1 to BLm may be transmitted to the n number of memory cell devices MC1 to MCn connected to each other in series, and a data read operation or a data writing operation may thus be performed.

Figure 3:
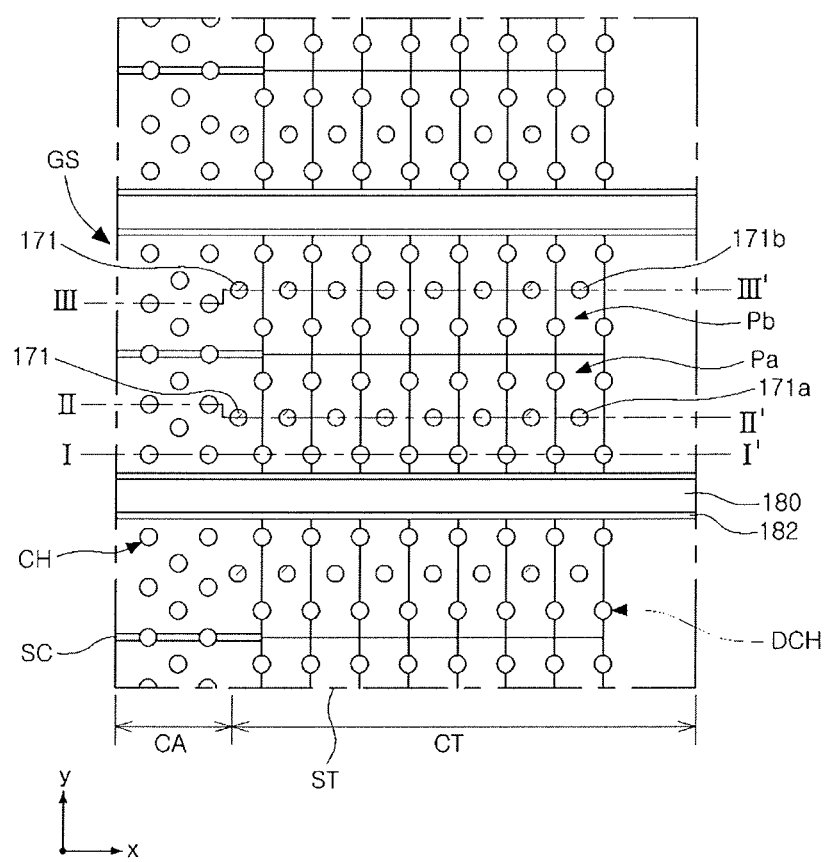
FIG. 3 is a schematic plan view of a vertical memory device according to an example embodiment of the present inventive concept.

FIG. 3 is a schematic plan view of a vertical memory device according to an example embodiment of the present inventive concept.

Referring to FIG. 3, the vertical memory device according to an example embodiment may include a cell array region CA on which memory cells are formed, and a connection region CT on which the memory cells are connected to metal interconnects. FIG. 3 illustrates a portion of the cell array region CA and the connection region CT disposed on one side of the cell array region CA, but the connection region CT may be disposed on opposite sides of the cell array region CA. Meanwhile, a peripheral circuit region may be provided outside the connection region CT, and may have a plurality of transistors disposed thereon to form the driving circuit 30, the read/write circuit 40, and the control circuit 50 of FIG. 1.

The vertical memory device may include a plurality of gate stacks GS separated from each other in a y-axis direction by common source lines 180. Each of the gate stacks GS may include a plurality of gate electrode layers and a plurality of insulating layers alternately stacked on a substrate. The common source lines 180 may extend from the cell array region CA to the connection region CT. The common source lines 180 may be electrically connected to the substrate. The common source lines 180 may include a conductive material. For example, the common source lines 180 may contain tungsten (W). An insulating layer 182 may be interposed between each of the common source lines 180 and each of the gate stacks GS, and the insulating layer 182 may electrically insulate each of the common source lines 180 from each of the gate stacks GS. The insulating layer 182 may include a silicon oxide ($SiO_2$), a silicon nitride ($Si_3N_4$), a silicon oxynitride (SiON) or combinations thereof.

The cell array region CA may have a plurality of channel columns CH disposed thereon to pass through each of the gate stacks GS, and the connection region CT may have contact plugs 171, first contact plugs 171a, second contact plugs 171b, and a plurality of dummy channel columns DCH disposed thereon.

Each of the gate stacks GS may extend in an x-axis direction, and may form a stepped structure including a plurality of step layers ST on the connection region CT. The stepped structure may be formed by a plurality of gate electrode layers and a plurality of insulating layers extending from the cell array region CA in the x-axis direction to have different lengths. For example, the lengths of the plurality of gate electrode layers may downwardly increase. An uppermost gate electrode layer of the plurality of gate electrode layers may have the smallest length among the plurality of gate electrode layers. A lowermost gate electrode layer of the plurality of the gate electrode layers may have the largest length among the plurality of gate electrode layers. Each of the gate stacks GS may include a plurality of first pad regions Pa and a plurality of second pad regions Pb. The first contact plugs 171a may be disposed on the first pad regions Pa, respectively, and the second contact plugs 171b may be disposed on the second pad regions Pb, respectively. Each of the gate stacks GS may have a separation insulation pattern SC selectively disposed on an upper portion thereof, and the separation insulation pattern SC may divide, into two regions, the uppermost gate electrode layer 133 of FIG. 4 functioning as the string select line SSL of FIG. 2 among the gate electrode layers. The contact plugs 171 may be disposed on the two divided regions of the uppermost electrode layer 133 of FIG. 4, respectively.

The cell array region CA may have the plurality of channel columns CH disposed in nine columns in the y-axis direction. The plurality of channel columns CH may be disposed in zigzag order to increase the number of the channel columns CH disposed on the cell array region CA. The channel columns CH in a central fifth column of the nine columns may be formed on a region on which the separation insulation pattern SC is disposed, and these channel columns CH may be dummy channel columns DCH that are not connected to bit lines. The arrangement of the plurality of channel columns CH is not limited thereto, and may be arranged in various ways.

Figure 17:
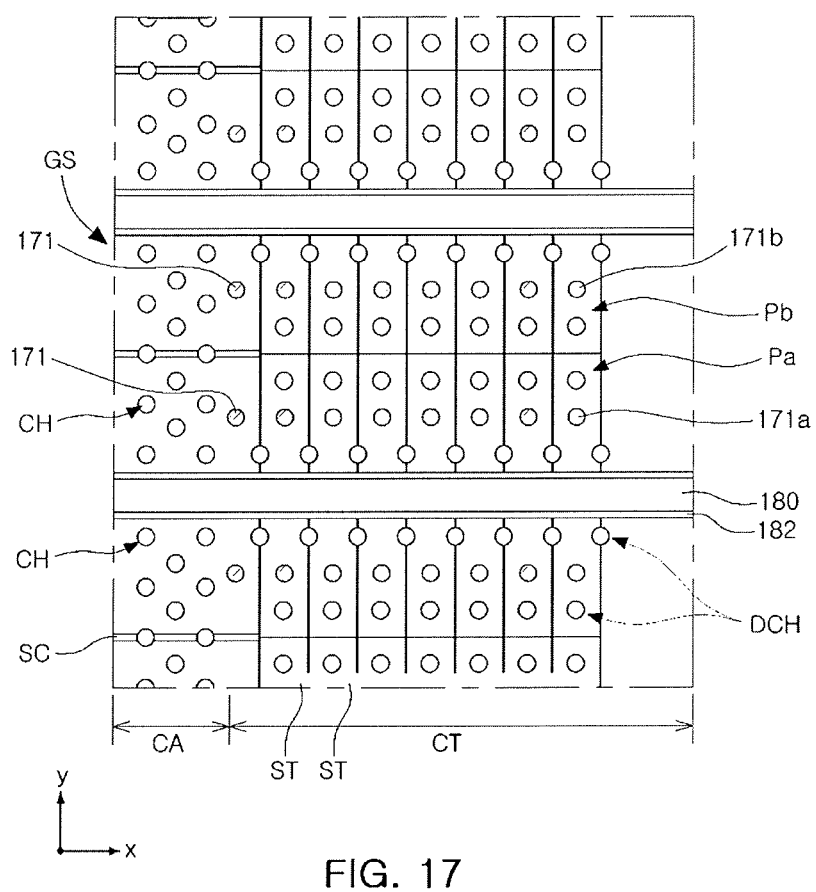
FIG. 17 is a schematic plan view of a vertical memory device according to an example embodiment of the present inventive concept.

The dummy channel columns DCH may be disposed to be adjacent to each of ends of the step layers ST. For example, the dummy channel columns DCH may be disposed to be adjacent to each of the ends of the first pad regions Pa and the second pad regions Pb. The dummy channel columns DCH may be illustrated to be disposed in four columns in the y-axis direction, but the arrangement of the dummy channel columns DCH is not limited thereto. For example, as illustrated in FIG. 17, a portion of the dummy channel columns DCH disposed at edges of the step layers ST close to the common source lines 180 among the dummy channel columns DCH may be disposed to be adjacent to the ends of the step layers ST, and the remainder of the dummy channel columns DCH may be disposed inside the step layers ST.

In the present specification, the term "dummy" may be used to refer to a component that has the same or a similar structure and shape to those of other components, and present as a pattern without a practical function within a memory device. Therefore, a "dummy" component need not receive an electrical signal, or may not electrically perform a particular function.

Figure 4:
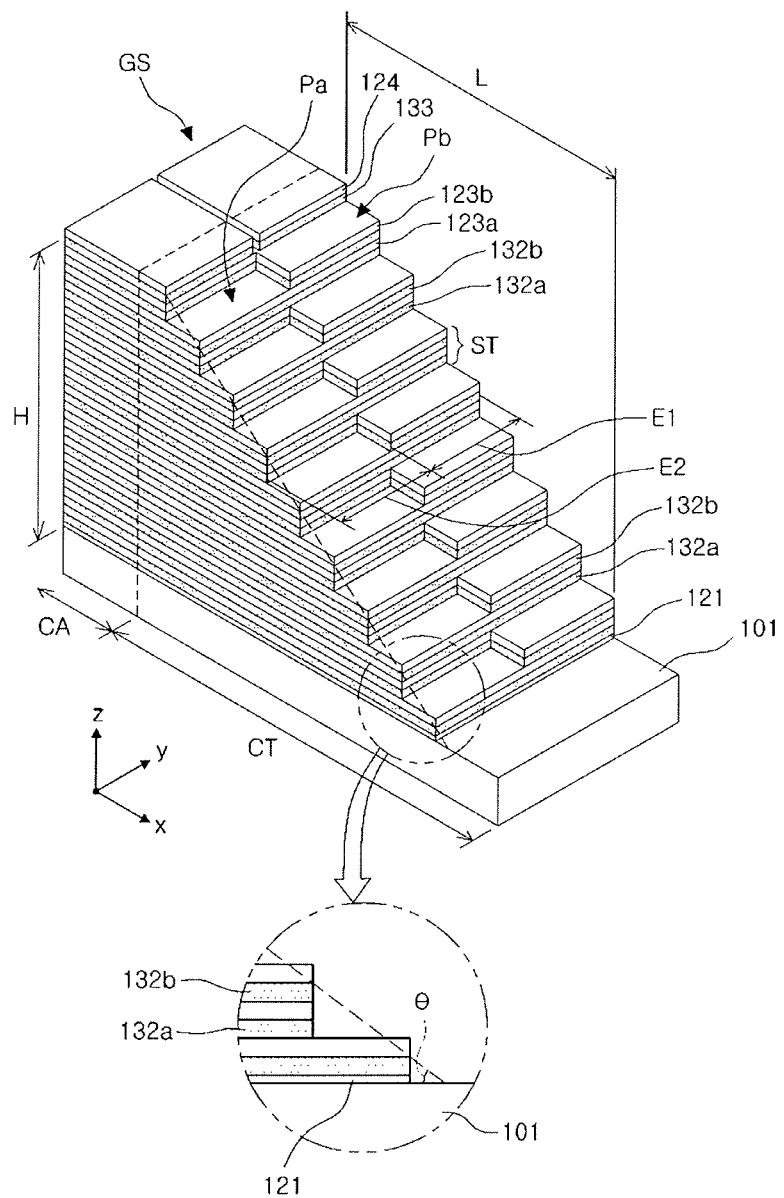
FIGS. 4 and 5 are perspective views of vertical memory devices according to an example of the present inventive concept, respectively.

FIG. 4 is a perspective view illustrating a structure of a vertical memory device according to an example embodiment of the present inventive concept. FIG. 4 is a diagram illustrating a structure of a single gate stack GS of FIG. 3 disposed between two adjacent common source lines 180. For the convenience of a description, the channel columns CH, the dummy channel columns DCH, the contact plugs 171, the first contact plugs 171a, and the second contact plugs 171b illustrated in FIG. 3 are omitted from FIG. 4.

Referring to FIG. 4, the gate stack GS may include first gate electrode layers 132a, second gate electrode layers 132b, and an uppermost gate electrode layer 133 stacked to be spaced apart from each other in a z-axis direction on a substrate 101 having a cell array region CA and a connection region CT. The substrate 101 may have an upper surface extending in an x- and a y-axis direction. The substrate 101 may contain a semiconductor material, such as a group IV semiconductor, a group III-V compound semiconductor, or a group II-VI compound semiconductor.

The gate stack GS may include first insulating layers 123a and second insulating layers 123b disposed among the first gate electrode layers 132a, the second gate electrode layer 132b, and the uppermost gate electrode layer 133. The gate stack GS may include an insulating layer 124 disposed on the uppermost gate electrode layer 133 and an insulating layer 121 between a lowermost gate electrode layer 132a and the substrate 101. For example, the gate stack GS may be a structure in which the first insulating layers 123a, the second insulating layers 123b, and the insulating layer 124, and the first gate electrode layers 132a, the second gate electrode layers 132b, and the uppermost gate electrode layer 133 are alternately stacked on the substrate 101. The number of each of the first gate electrode layers 132a and the second gate electrode layers 132b forming the gate stack GS is not limited to that of each of the first gate electrode layers 132a and the second gate electrode layers 132b illustrated in FIG. 4. Depending on storage capacity of a vertical memory device, the number of each of the first gate electrode layers 132a and the second gate electrode layers 132b forming memory cells may be determined, and for example, the first gate electrode layers 132a and the second gate electrode layers 132b having 60 or more layers, for example, may be stacked on the substrate 101 to form the gate stack GS. According to an example embodiment, a full height of the gate stack GS on the cell array region CA may be from about 3.5 μm to about 10 μm. For example, a height H from an upper surface of the substrate 101 to that of the uppermost electrode layer 133 may be from about 3.5 μm to about 10 μm.

In an example embodiment, the uppermost gate electrode layer 133 may form the string select line SSL of FIG. 2, and the lowermost gate electrode layer 132a may form the ground select line GSL of FIG. 2. Except for the uppermost gate electrode layer 133 and the lowermost gate electrode layer 132a, the remainder of the first gate electrode layers 132a and the second gate electrode layers 132b may form the word lines WL of FIG. 2 included in the memory cells.

The first gate electrode layers 132a, the second gate electrode layers 132b, and the uppermost gate electrode layer 133 may contain a conductive material. The first gate electrode layers 132a, the second gate electrode layers 132b, and the uppermost gate electrode layer 133 may contain, for example, a metallic material, a metal nitride, a metal silicide material, polycrystalline silicon, and the like. The metallic material may contain tungsten (W), and the metal silicide material may include cobalt (Co), nickel (Ni), hafnium (Hf), platinum (Pt), W, titanium (Ti), or combinations thereof. The metal nitride may include a tungsten nitride (WN), a tantalum nitride (TaN), a titanium nitride (TiN), or combinations thereof. The first gate electrode layers 132a and the second gate electrode layers 132b may be electrically insulated from each other by the first insulating layers 123a and the second insulating layers 123b. The first insulating layers 123a and the second insulating layers 123b may contain silicon oxides.

The first gate electrode layers 132a, the second gate electrode layers 132b, and the uppermost gate electrode layer 133 may extend from the cell array region CA to the connection region CT in the x-axis direction. The first gate electrode layers 132a, the second gate electrode layers 132b, and the uppermost gate electrode layer 133 may extend in the x-axis direction on the connection region CT by different lengths to form a stepped structure. The first gate electrode layers 132a and the second gate electrode layers 132b extending in the x-axis direction may become longer towards a bottom of the gate stack GS by predetermined lengths, respectively. Each of step layers ST forming the stepped structure may include two gate electrode layers including the first gate electrode layer 132a, and the second gate electrode layer 132b. For example, a pair of the first gate electrode layer 132a and the second gate electrode layer 132b may form a step layer ST. The length of the step layer ST may increase stepwise by a predetermined length downwardly toward the substrate 101. Each of the step layers ST may have a structure in which the second gate electrode layer 132b is spaced apart from the first gate electrode layer 132a in the z-axis direction to be stacked thereabove. For example, the second gate electrode layer 132b may be higher than the first gate electrode layer 132a in each step layer ST. The first insulating layer 123a and the second insulating layer 123b may also form the stepped structure along with the first gate electrode layer 132a and the second gate electrode layer 132b by extending in the x-axis direction as the first gate electrode layer 132a and the second gate electrode layer 132b. The first gate electrode layer 132a may have the first insulating layer 123a disposed thereon, and the second gate electrode layer 132b may have the second insulating layer 123b disposed thereon. An uppermost step layer ST among the step layers ST of the gate stack GS may be illustrated to include a single gate electrode layer 133, but is not limited thereto. According to an example embodiment, the uppermost step layer ST may include two gate electrode layers. In this case, two string select lines SSL may be provided.

When viewed from the above of the substrate 101, at least a portion of the first gate electrode layer 132a and the second gate electrode layer 132b forming a single step layer ST need not overlap each other. A portion of an end of the second gate electrode layer 132b positioned above the first gate electrode layer 132a may be removed, and a shape of the end of the second gate electrode layer 132b may be different from that of an end of the first gate electrode layer 132a. In other words, the second gate electrode layer 132b may include a first region E1 in which the second gate electrode layer 132b may extend by the same length as the first gate electrode layer 132a, and a second region E2 in which the second gate electrode layer 132b may be shorter than the first gate electrode layer 132a. For example, the second gate electrode layer 132b may have a length of the second region E2 shorter than that of the first region E1 by a depth of the step layer ST. Here, the depth of the step layer ST may be defined by a difference between lengths of two adjacent step layers ST in the z-axis direction and extending in the x-axis direction. The length of the second region E2 may be the same as that of another step layer ST adjacent to the step layer ST in the z-axis direction and positioned at an upper portion of the step layer ST. For example, the second region E2 of the step layers ST may have the same length. The second region E2 extending by a length shorter than that of the first region E1 may expose a portion of the first gate electrode layer 132a, positioned below the second region E2. Further, the first insulating layer 123a may have the same shape as the first gate electrode layer 132a, and the second insulating layer 123b may have the same shape as the second gate electrode layer 132b. In each of the step layers ST, a portion of the first gate electrode layer 132a not covered by the second gate electrode layer 132b may form a first pad region Pa, and a portion of the second gate electrode layer 132b may form a second pad region Pb spaced apart from the first pad region Pa in the z-axis direction.

Such shapes of ends of the second gate electrode layer 132b and the second insulating layer 123b may form a short stepped structure in the y-axis direction in each of the step layers ST. In other words, the first pad region Pa and the second pad region Pb may form the short stepped structure in the y-axis direction in each of the step layers ST. The stepped structure of the step layers ST formed in the x-axis direction may be referred to as a first stepped structure, and the stepped structure formed in the y-axis direction that each of the step layers ST has may be referred to as a second stepped structure. A height of each of the step layers ST in the second stepped structure may be about half of that of each of the step layers ST in the first stepped structure.

According to an example embodiment, a gate stack GS on a connection region CT may have a stepped structure having the first stepped structure and the second stepped structure, and the stepped structure may provide pad regions in a full length L. The full length L of the stepped structure may thus be reduced by half, as compared to a conventional stepped structure in which each of step layers ST includes a single gate electrode layer. In the present specification, the full length L of the stepped structure may be defined by a horizontal distance from an end of the uppermost gate electrode layer 133 to that of the lowermost gate electrode layer 132a.

For the convenience of a description, each of the step layers ST includes two gate electrode layers 132a and 132b. However, the present inventive concept is not limited thereto. For example, each of the step layers ST forming the first stepped structure may include three gate electrode layers, and the second stepped structure may include three stepped layers. For example, a structure in which three pad regions spaced apart from one another in the z-axis direction are disposed on each of the step layers ST forming the first stepped structure may be formed. In such a manner, the first stepped structure on the connection region CT may be modified to a structure in which four or more pad regions spaced apart from each other in the z-axis direction are disposed in each of the step layers ST.

According to example embodiments, a full length L of the first stepped structure for providing a plurality of pad regions on the connection region CT may be reduced by changing the number of gate electrode layers in each of the step layers ST. For example, more gate electrode layers each of the step layers ST has, smaller the full length L of the stepped structure formed by the step layers ST. In an example embodiment, when the number of gate electrode layers stacked on the substrate 101 is increased so that a full height of the gate stack GS on the cell array region CA may be from about 3.5 µm to about 10 µm, a full length L of the first stepped structure on the connection region CT may be from about 10 µm to about 28 µm. In other words, when the height of the gate stack GS on the cell array region CA is from about 3.5 µm to about 10 µm, an angle between the upper surface of the substrate 101 and a virtual line connecting the end of the uppermost gate electrode layer 133 to that of the lowermost gate electrode layer 132a may be from about 7 degrees to about 45 degrees. When such a structural design rule is satisfied, thickness distribution of epitaxial layers disposed on lower portions of dummy channel columns DCH of FIG. 6 on the connection region CT adjacent to the cell array region CA may be reduced, and heights of epitaxial layers 151 of FIG. 6 disposed on the lower portions of the dummy channel columns DCH of FIG. 6 at an end of the connection region CT may be prevented from being lower than a height of the upper surface of the lowermost gate electrode layer 132a. This will be described below in more detail with reference to FIGS. 6 and 7.

Figure 5:
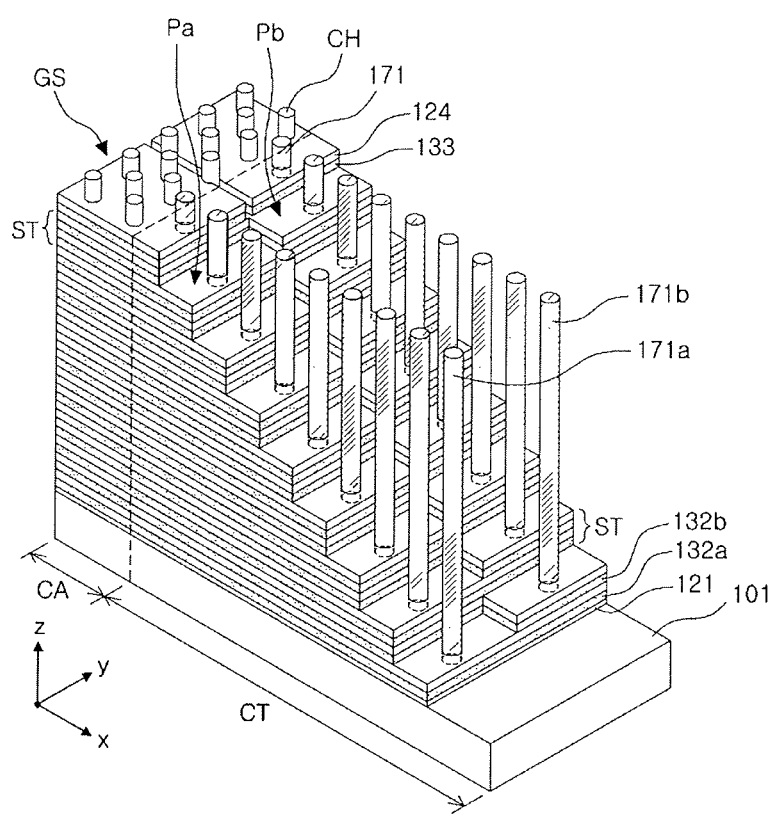
Figure 8:
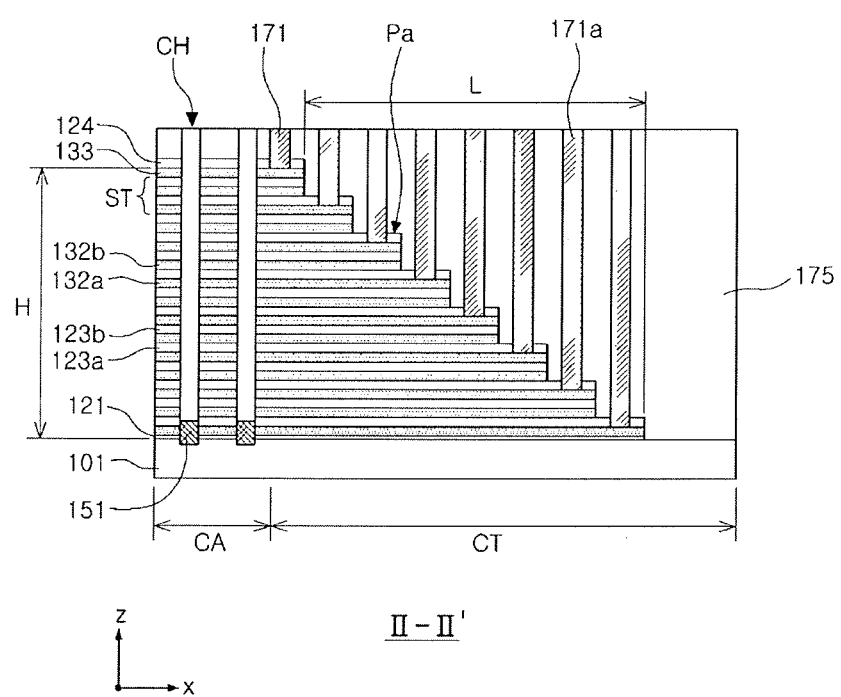
Figure 9:
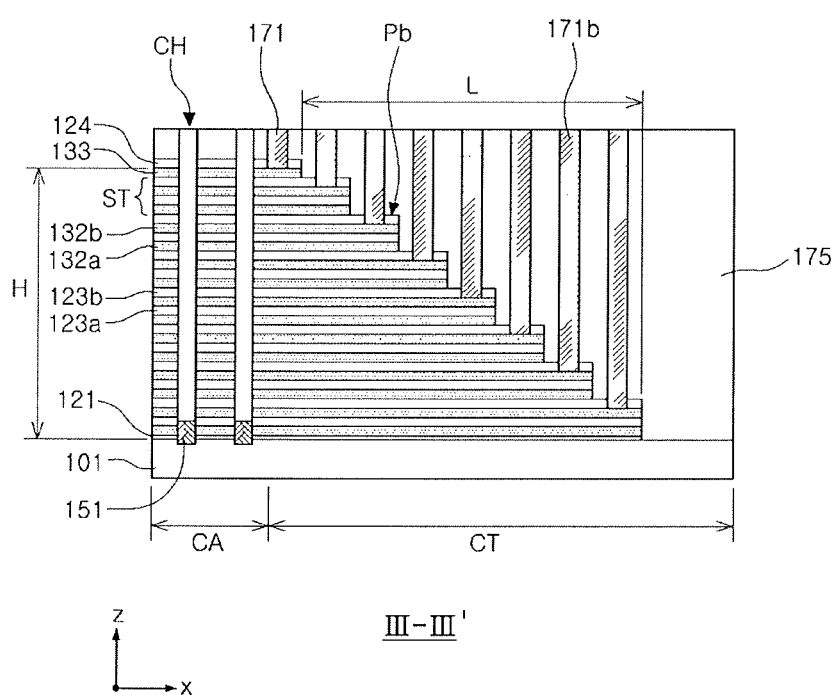

FIG. 5 is a perspective view of a vertical memory device according to an example embodiment of the present inventive concept. A structure illustrated in FIG. 5 may include channel columns CH, contact plugs 171, first contact plugs 171a, and second contact plugs 171b formed on the gate stack GS illustrated in FIG. 4. FIG. 8 is a cross-sectional view taken along line II-II' of FIG. 3, and FIG. 9 is a cross-sectional view taken along line III-III' of FIG. 3.

Referring to FIG. 5, the plurality of channel columns CH having nine columns disposed in an y-axis direction on a cell array region CA may pass through a gate stack GS in a z-axis direction to extend to a substrate 101. Though not illustrated for convenience of description, dummy channel columns DCH as described with reference to FIG. 3 may be disposed to be adjacent to ends of respective step layers ST on a connection region CT, and may extend to the substrate 101 in a direction parallel to the channel columns CH (refer to FIG. 6). To apply an electrical signal to a plurality of first gate electrode layers 132a and second gate electrode layers 132b forming the gate stack GS, the first contact plugs 171a and second contact plugs 171b extending in the z-axis direction may be disposed on the plurality of the first gate electrode layers 132a and the second gate electrode layers 132b, respectively. The farther the first contact plugs 171a and the second contact plugs 171b are spaced apart from the cell array region CA, the longer the first contact plugs 171a and the second contact plugs 171b extending in the z-axis direction are. The contact plugs 171 may be connected to two divided portions of a uppermost electrode layer 133, respectively. The first contact plugs 171a may be disposed in the first pad regions Pa to be electrically connected to the first gate electrode layers 132a, respectively, and the second contact plugs 171b may be disposed in the second pad regions Pb to be electrically connected to the second gate electrode layers 132b, respectively.

In FIG. 5, the first contact plugs 171a and the second contact plugs 171b may be disposed in two columns in the x-axis direction, and one first contact plug 171a and one second contact plug 171b may be disposed on a first pad region Pa and a second pad region Pb, respectively, but an arrangement of the first contact plugs 171a and the second contact plugs 171b is not limited thereto.

In an exemplary embodiment, a plurality of contact plugs 171a and 171b is arranged in an M×N array on the stepped structure. M represents a number of contact plug columns and N represents a number of contact plug rows. M and N are integer numbers. M is equal to or greater than 2. For the convenience of description, M is two and N is nine. The first contact plugs 171a and the second contact plugs 171b arranged along the x-axis correspond to contact plug columns, and the first contact plugs 171a and the second contact plugs 171b arranged along the y-axis correspond to the contact plug rows.

Referring to FIGS. 8 and 9, the contact plugs 171, the first contact plugs 171a, and the second contact plugs 171b passing through an interlayer insulating layer 175 in the z-axis direction may be connected to the first gate electrode layers 132a, the second gate electrode layers 132b, and the uppermost gate electrode layer 133. The first contact plugs 171a on the first pad regions Pa may pass through the interlayer insulating layer 175 and the first insulating layers 123a to be connected to the first gate electrode layers 132a, respectively. The second contact plugs 171b on the second pad regions Pb may pass through the interlayer insulating layer 175 and the second insulating layers 123b to be connected to the second gate electrode layers 132b, respectively. The contact plugs 171 may pass through the interlayer insulating layer 175 and the insulating layer 124 to be connected to the two portions of the uppermost electrode layer 133 divided by the separation insulation pattern SC, respectively. The contact plugs 171 may include conductive materials, and for example, the conductive materials may contain tungsten (W).

Figure 6:
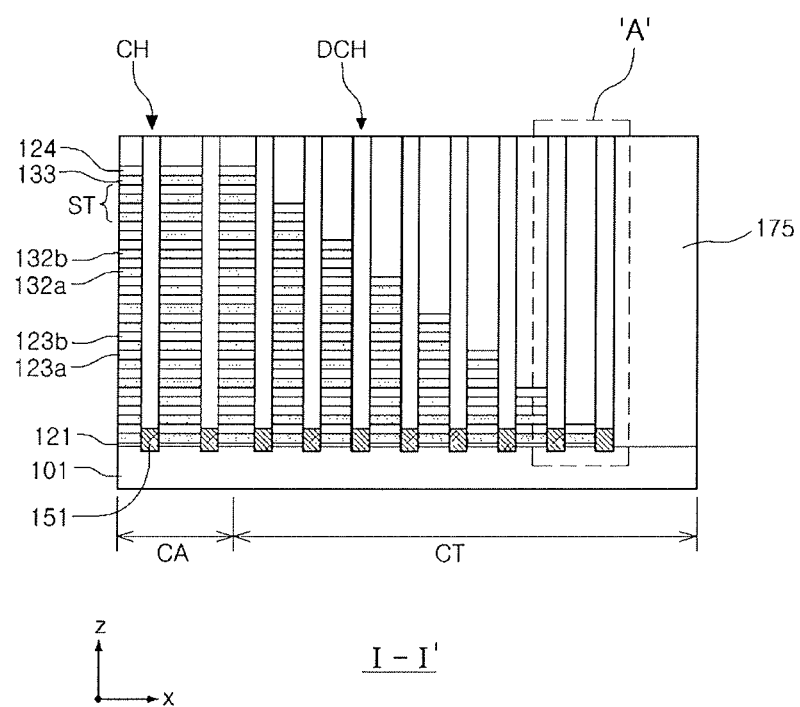
FIGS. 6 through 9 are schematic cross-sectional views of vertical memory devices according to an example embodiment of the present inventive concept, respectively.
Figure 7:
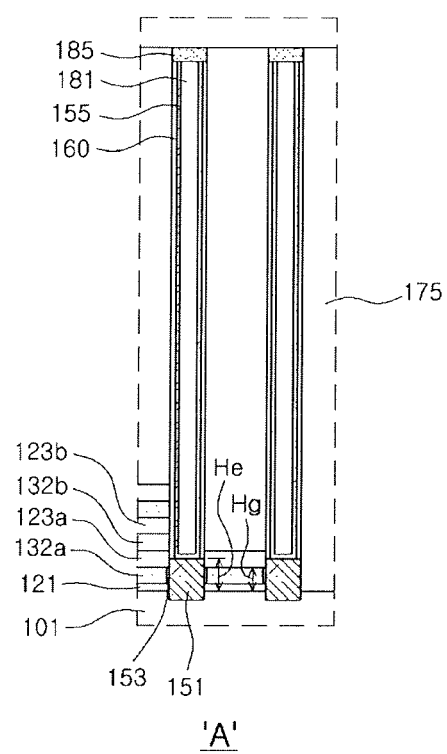

FIG. 6 is a cross-sectional view taken along line I-I' of FIG. 3, and FIG. 7 is an enlarged view of region A of FIG. 6.

Referring to FIGS. 6 and 7, the cell array region CA may have the channel columns CH disposed thereon to extend in the z-axis direction perpendicular to the upper surface of the substrate 101 and to pass through the gate stack GS (GS of FIG. 3) including the first gate electrode layers 132a, the second gate electrode layers 132b, the first insulating layers 123a, and the second insulating layers 123b. The connection region CT may have the plurality of dummy channel columns DCH disposed thereon to extend in the z-axis direction. The dummy channel columns DCH may be disposed to be adjacent to the ends of the respective step layers ST forming the first stepped structure of the gate stack GS. The channel columns CH and the dummy channel columns DCH may have the same structure, and the structure of the dummy channel columns DCH illustrated in FIG. 7 may be applied to the channel columns CH in the same manner.

The channel columns CH and the dummy channel columns DCH may include the epitaxial layers on the lower portions thereof. The epitaxial layers 151 may be formed in recessed regions of the substrate 101, respectively. The epitaxial layers 151 may be formed by using a selective epitaxial growth (SEG) process. The epitaxial layers 151 may include a single layer or a plurality of layers. The epitaxial layers 151 may contain polycrystalline silicon (Si), monocrystalline Si, polycrystalline germanium (Ge) or monocrystalline Ge that are or are not doped with an impurity. For example, when the substrate 101 corresponds to monocrystalline Si, the epitaxial layers 151 may also be monocrystalline Si.

Heights of upper surfaces of the epitaxial layers 151 respectively disposed on the lower portions of the channel columns CH on the cell array region CA, may be higher than that of the upper surface of the lowermost gate electrode layer 132a included in the gate stack GS. This is the reason why the lowermost gate electrode layer 132a may function as the ground select line GSL of FIG. 2, and oxide layers 153 formed between side surfaces of the epitaxial layers 151 and the lowermost gate electrode layer 132a may be used as a gate insulating layer of the ground select transistor GST of FIG. 2. The epitaxial layers 151 may allow the channel columns CH to be electrically connected to the substrate 101 even though an aspect ratio of the channel columns CH is increased, and may enable the characteristics of the ground select transistors GSTs disposed on the lower portions of the channel columns CH to remain uniform. Similarly, heights He of the upper surfaces of the epitaxial layers 151 respectively disposed on the lower portions of the dummy channel columns DCH on the connection region CT may be higher than a height Hg of the upper surface of the lowermost gate electrode layer 132a included in the gate stack GS. The channel columns CH and the dummy channel columns DCH may share the lowermost gate electrode layer 132a functioning as the ground select line GSL, and the same level of voltage may be applied to dummy transistors respectively disposed on the lower portions of the dummy channel columns DCH while a level of voltage is applied to the ground select line GSL to operate the ground select transistors GSTs respectively disposed on the lower portions of the channel columns CH. Therefore, when the heights He of the upper surfaces of the epitaxial layers 151 respectively disposed on the lower portions of the dummy channel columns DCH are lower than the height Hg of the upper surface of the lowermost gate electrode layer 132a included in the gate stack GS, the oxide layers 153 used as the gate insulating layer of the dummy transistors need not be properly formed, and reliability of the vertical memory device may thus be reduced. In the present specification, a transistor having the same structure as the ground select transistor GSTs respectively formed on the lower portions of the dummy channel columns DCH may be referred to as "a dummy transistor".

In accordance with a process of manufacturing the channel columns CH and the dummy channel columns DCH, the heights He of the upper surfaces of the epitaxial layers 151 may tend to be decreased away from the cell array region CA. Meanwhile, as the number of the first gate electrode layers 132a and the second gate electrode layers 132b stacked on the substrate 101 increases, the full length of the stepped structure on the connection region CT may be increased. For example, in a conventional stepped structure in which each of step layers ST includes a single gate electrode layer, 60 or more first gate electrode layers 132a and second gate electrode layers 132b may be stacked on each other, and the full length of the stepped structure on the connection region may be greater than about 28 μm. In this case, the heights He of the upper surfaces of the epitaxial layers 151 may be lower than the height Hg of the upper surface of the lowermost gate electrode layer 132a at an end of the connection region. Therefore, to make the heights He of the upper surfaces of the epitaxial layers 151 respectively disposed on the lower portions of the dummy channel columns DCH higher than the height Hg of the upper surface of the lowermost gate electrode layer 132a at the end of the connection region, the full length of the stepped structure on the connection region CT may be less than or equal to about 28 μm even in a case in which the first gate electrode layers 132a and the second gate electrode layers 132b having 60 or more layers are stacked on each other so that the full height of the gate stack GS on the cell array region CA may be greater than or equal to about 3.5 μm. To address the above issue, the present inventive concept may include a structural design rule below. When the full height of the gate stack GS on the cell array region CA is from about 3.5 μm to about 10 μm, the full length L of the stepped structure on the connection region CT may be from about 10 μm to about 28 μm.

Hereinafter, it will be described that the farther the channel columns CH and the dummy channel columns DCH are spaced apart from the cell array region CA, the lower the heights of the epitaxial layers 151 respectively disposed on the lower portions of each of the channel columns CH and the dummy channel columns DCH are.

The process of forming the channel columns CH and the dummy channel columns DCH may be performed by a single operation.

First, a process of forming a certain mask layer on insulating layers and sacrificial layers alternately stacked on the substrate 101 may performed. An anisotropic etching process performed on the sacrificial layers and the insulating layers exposed by the mask layer and a process of trimming the mask layer may be repeated to form a mold structure. In this case, the trimming process of the mask layer is performed after the anisotropic etching process. For example, the insulating layers may be silicon oxide layers, and the sacrificial layers may be silicon nitride layers. The mold structure may have the same stepped structure as that of the gate stack GS illustrated in FIG. 4 on the connection region. In other words, the mold structure may be a structure in which the sacrificial layers are disposed in lieu of the first gate electrode layers 132a, the second gate electrode layers 132b, and the uppermost gate electrode layer 133 in the structure of the gate stack GS illustrated with reference to FIG. 4. In the following process, the sacrificial layers may be replaced with the first gate electrode layers 132a, the second gate electrode layers 132b, and the uppermost gate electrode layer 133 to form the gate stack GS.

The interlayer insulating layer 175 of FIG. 6 may be formed to cover the mold structure. By anisotropically etching the interlayer insulating layer 175 and the mold structure, opening portions may be formed in positions in which the channel columns CH and the dummy channel columns DCH may be formed. In this case, the opening portions for forming the channel columns CH may be formed more densely than the opening portions for forming the dummy channel columns DCH (refer to FIG. 3). Recessed regions having predetermined depths may be formed in the substrate 101 exposed by the opening portions.

The epitaxial layers 151 may be formed in the recessed regions of the substrate 101 exposed by the opening portions, respectively. Prior to the formation of the epitaxial layers 151, a bake process may be performed to discharge gases outgassed from the interlayer insulating layer 175. Because a thickness of the interlayer insulating layer 175 may become greater as a distance from the cell array region CA is increased, a quantity of the gases outgassed from the interlayer insulating layer 175 may increase. In addition, because the number of the opening portions acting as discharge paths of the outgassed gases decreases as the distance from the cell array region CA is increased, the gases outgassed from the interlayer insulating layer 175 may be difficult to discharge towards an end of the connection region CT during the bake process. Gases remaining in the interlayer insulating layer 175 at the end of the connection region CT may be outgassed in a following process of forming the epitaxial layers 151 to hinder the inflow of source gases to the openings. The outgassed gases may slow growth of the epitaxial layers 151 within the opening portions positioned at the end of the connection region CT.

As the numbers of the insulating layers and the sacrificial layers stacked on the substrate 101 increase for high memory capacity, the height of the mold structure increases, the height of the interlayer insulating layer 175 formed at the end of the connection region CT may be gradually increased. The higher the height of the interlayer insulating layer 175 is, the more the influence of the outgassed gases is increased, and the height of the epitaxial layer 151 at the end of the connection region CT may thus be lower than the height of the upper surface of the lowermost gate electrode layer 132a. The influence of the outgassed gases may be intensified in the case that the full length of the stepped structure provided in the mold structure is greater than about 28 µm.

Therefore, to address such a slow growth of the epitaxial layers 151 at the end of the connection region CT, the full length of the stepped structure provided in the mold structure may be controlled to be less than or equal to about 28 µm according to an example embodiment of the present inventive concept.

Referring to FIG. 7, each of the dummy channel columns DCH may include a channel region 155 formed on each of the epitaxial layers 151, a gate insulating layer 160, an embedded insulating layer 181, and a conductive layer 185. The channel columns CH disposed on the cell array region CA may have the same structure as that of the dummy channel columns DCH, and the description of the dummy channel columns DCH may thus be equally applied to that of the channel columns CH below.

The channel region 155 may be formed within an opening portion having a circular cross-section, and the embedded insulating layer 181 may also be provided inside the channel region 155 having a hollow ring shape. The channel region 155 may have the conductive layer 185 provided thereon, and may be connected to a bit line through the conductive layer 185. The channel region 155 may contain a semiconductor material such as polycrystalline silicon or monocrystalline silicon, and the semiconductor material may be a material undoped with an impurity, or a material containing a p- or n-type impurity.

The gate insulating layer 160 may be disposed between the channel layer 155 and the first gate electrode layers 132a and the second gate electrode layers 132b. The gate insulating layer 160 may include a tunneling layer, an electric charge storage layer, and a blocking layer sequentially stacked from the channel region 155. In an embodiment illustrated in FIG. 7, the gate insulating layer 160 may be disposed outside the channel region 155 to extend in the z-axis direction in parallel with the channel region 155. The present inventive concept is not limited thereto. For example, the at least one layer of the gate insulating layer 160 having the tunneling layer, the electric charge storage layer, and the blocking layer may be disposed to surround the first gate electrode layers 132a and the second gate electrode layers 132b, and the remaining layer of the tunneling layer, the electric charge storage layer, and the blocking layer forming the gate insulating layer 160 may extend in the z-axis direction in parallel with the channel region 155 to be disposed outside the channel region 155.

The tunneling layer may include, for example, a silicon oxide ($SiO_2$).

The electric charge storage layer may be an electric charge trap layer or a conductive floating gate layer. For example, the electric charge storage layer may contain a dielectric material, quantum dots, or nanocrystals. Here, the quantum dots or the nanocrystals may include an electric conductor, such as microparticles of a metal or a semiconductor. When the electric charge storage layer is the electric charge trap layer, the electric charge storage layer may include $SiO_2$.

The blocking layer may include $SiO_2$, a silicon nitride ($Si_3N_4$), a silicon oxynitride (SiON) or a dielectric material having a high dielectric constant. The dielectric material having a high dielectric constant may at least one of an aluminum oxide ($Al_2O_3$), a tantalum oxide ($Ta_2O_3$), a titanium oxide ($TiO_2$), a yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), and a praseodymium oxide ($Pr_2O_3$). Meanwhile, the blocking layer may selectively include a plurality of layers having different dielectric constants, respectively. In this case, a material layer having a relatively low dielectric constant may be disposed to be adjacent to the electric charge storage layer.

Figure 10:
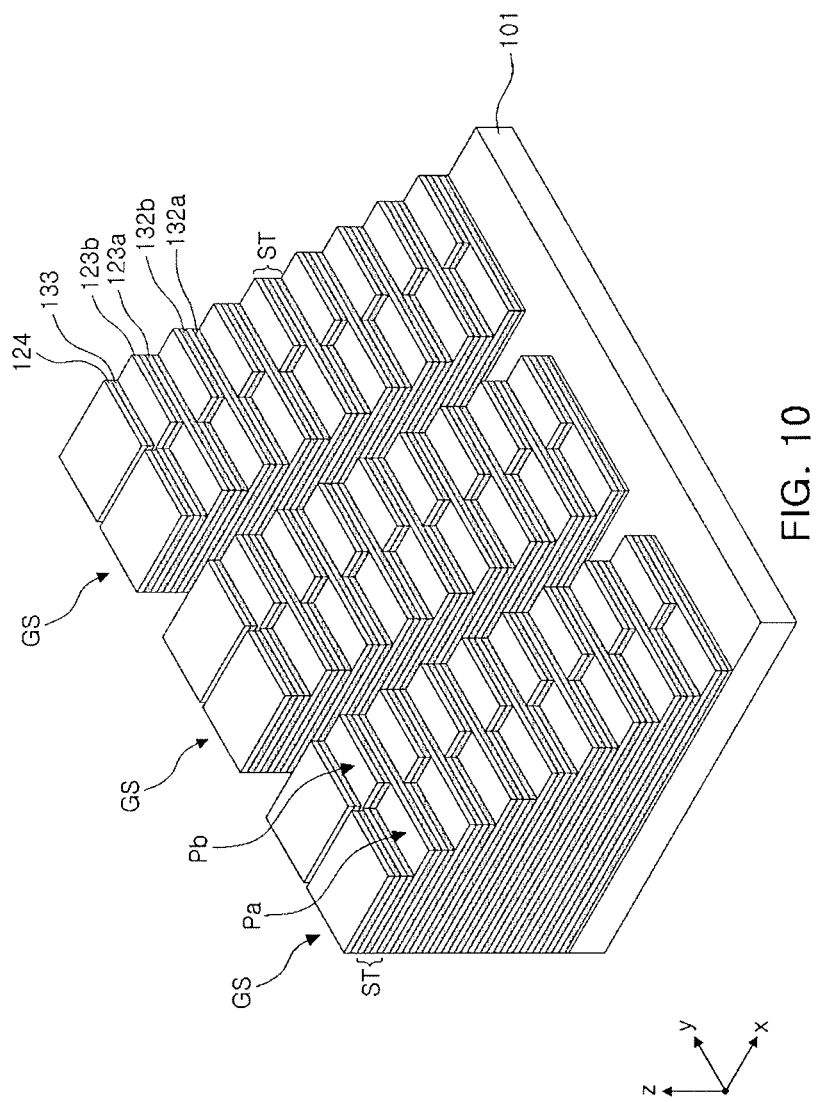
FIGS. 10 and 11 are perspective views of vertical memory devices according to an example of the present inventive concept, respectively.
Figure 11:
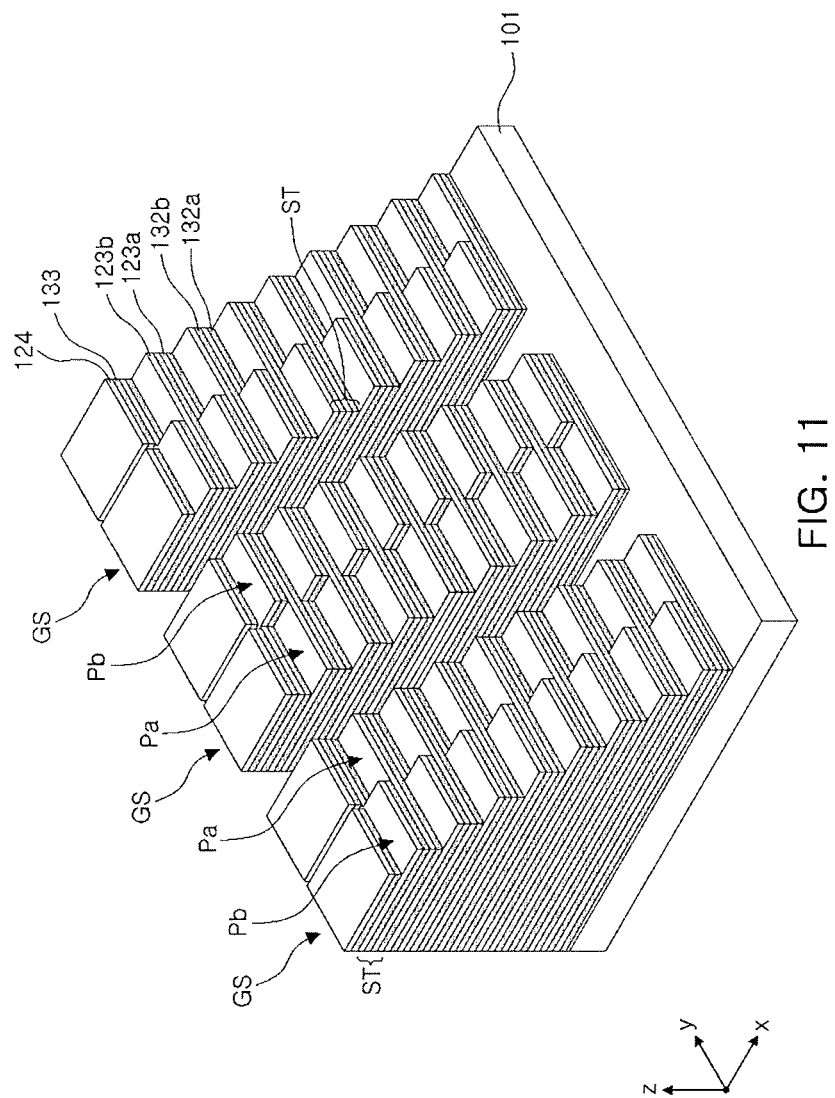

FIGS. 10 and 11 are schematic perspective views of vertical memory devices according to an example embodiment of the present inventive concept, respectively. FIGS. 10 and 11 may be diagrams illustrating arrangements of gate stacks GS according to an example embodiment of the present inventive concept, respectively.

Referring to FIG. 10, the vertical memory device according to an example embodiment may include a plurality of gate stacks GS. The gate stacks GS having the same structure as that of the gate stack GS illustrated in FIG. 4 may be spaced apart from each other in a y direction, and may be repeatedly disposed in such a manner that first pad regions Pa may be disposed with each other on the same position in each of the gate stacks GS.

Referring to FIG. 11, the vertical memory device according to an example embodiment may include a plurality of gate stacks GS. Unlike FIG. 10, the gate stacks GS may be disposed to be spaced apart from each other in the y-axis direction in such a manner that the first pad regions Pa may be disposed to be symmetrical to each other with respect to a virtual line between the gate stacks GS adjacent to each other. In other words, the gate stacks GS may be disposed in such a manner that the first pad regions Pa may face each other or second pad regions Pb may face each other between the gate stacks GS disposed to be adjacent to each other.

Figure 12:
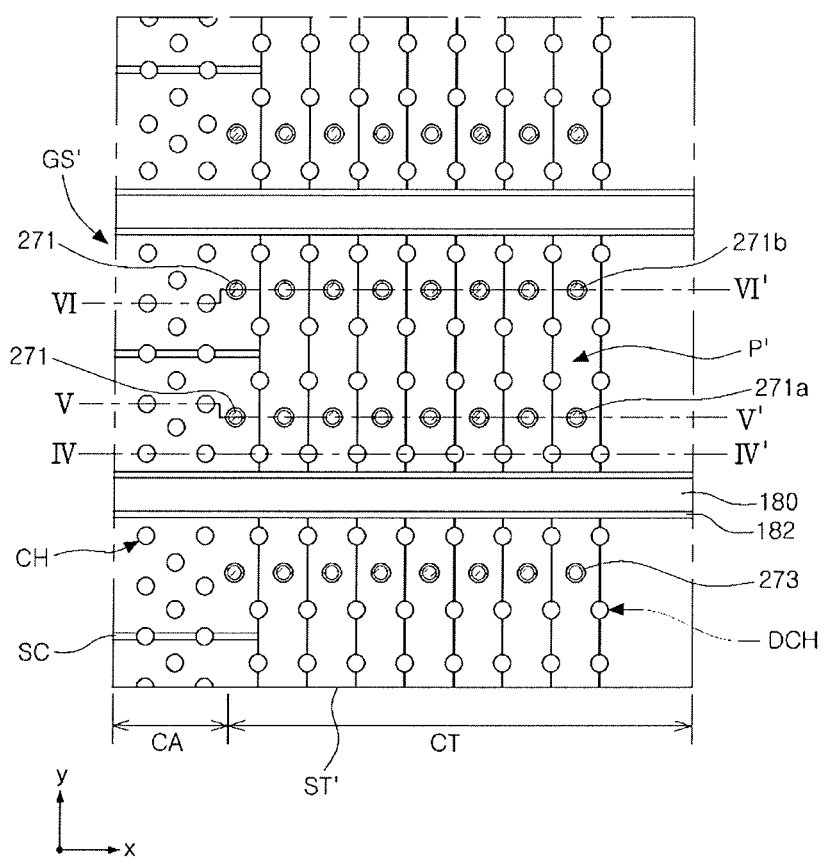
FIG. 12 is a schematic plan view of a vertical memory device according to an example embodiment of the present inventive concept.

FIG. 12 is a schematic plan view of a vertical memory device according to an example embodiment of the present inventive concept. The vertical memory device illustrated in FIG. 12 may have a pad region and a contact plug structure different from that of the vertical memory device illustrated in FIG. 3, and a duplicate description thereof will be briefly described.

Referring to FIG. 12, the vertical memory device according to an example embodiment may include a cell array region CA on which memory cells are formed, and a connection region CT on which the memory cells are connected to a wiring.

The vertical memory device may include a plurality of gate stacks GS' separated from each other in a y-axis direction by common source lines 180. Each of the gate stacks GS' may include a plurality of gate electrode layers and a plurality of insulating layers alternately stacked on each other on a substrate. The common source lines 180 may extend from the cell array region CA to the connection region CT.

The cell array region CA may have a plurality of channel columns CH disposed thereon to pass through each of the gate stacks GS', and the connection region CT may have contact plugs 271, first contact plugs 271a, second contact plugs 171b, and a plurality of dummy channel columns DCH disposed thereon.

The gate stacks GS' may extend in an x-axis direction, and may form stepped structures including a plurality of step layers ST, respectively, on the connection region CT. The stepped structures may be formed by a plurality of first gate electrode layers 132a, second gate electrode layers 132b, and uppermost electrode layers 133 and lowermost insulating layers 121, first insulating layers 123a, second insulating layers 123b, and top insulating layers 124 extending from the cell array region CA in the x-axis direction by different lengths, respectively. Each of the step layers ST may provide pad regions P'. Each of the pad regions P' may have a first contact plug 271a and a second contact plug 271b disposed thereon. Unlike the example embodiment illustrated in FIG. 3, each of the step layers ST may provide a single pad region P', the single pad region P' having the first contact plug 271a and the second contact plug 271b disposed thereon. Each of outer circumferential surfaces of the first contact plug 271a and the second contact plug 271b may be surrounded by a plug insulating layer 273.

Figure 13:
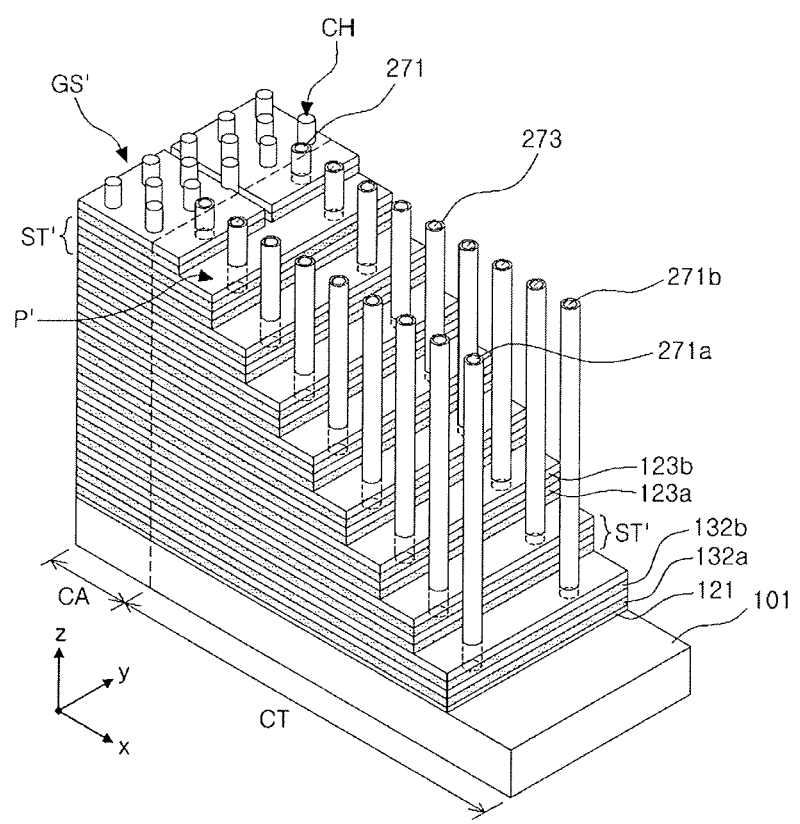
FIG. 13 is a perspective view of a structure of a vertical memory device according to an example embodiment of the present inventive concept.
Figure 15:
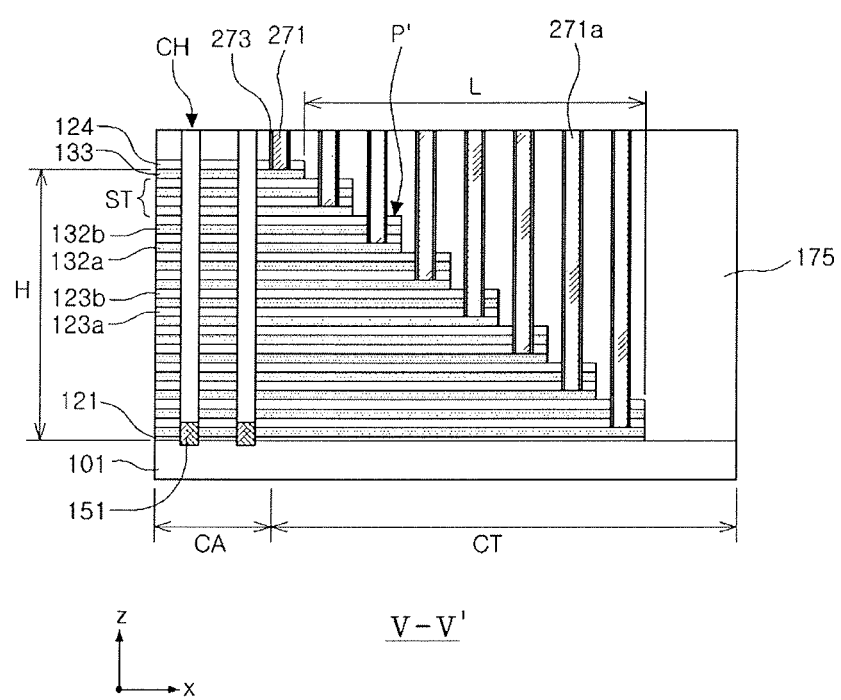

FIG. 13 is a perspective view illustrating a structure of a vertical memory device according to an example embodiment of the present inventive concept. FIG. 13 is a diagram illustrating a structure of a single gate stack GS'. For the convenience of a description, the dummy channel columns DCH may be removed from FIG. 13. FIG. 15 is a cross-sectional view taken along line V-V' of FIG. 12, and FIG. 16 is a cross-sectional view taken along line VI-VI' of FIG. 12.

Figure 16:
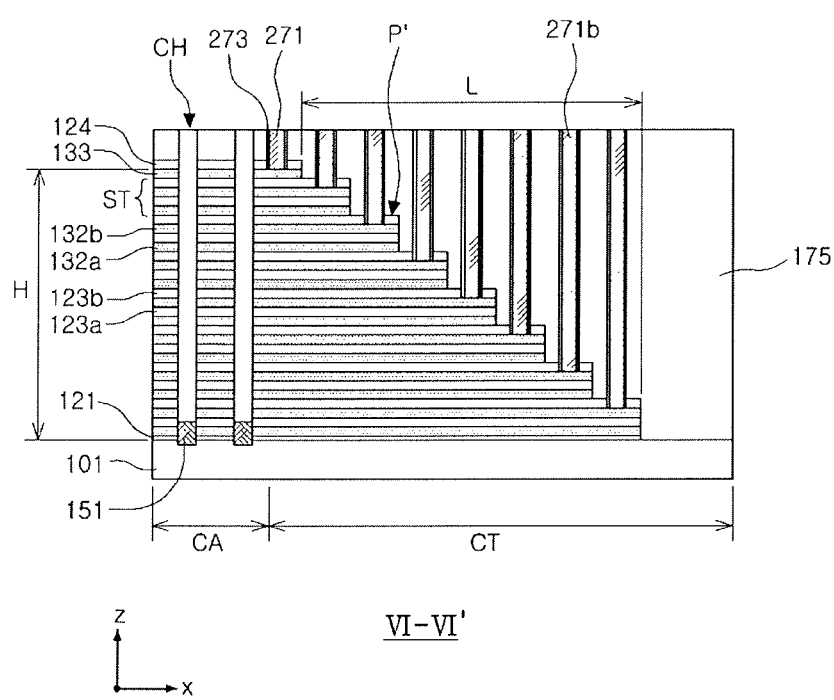

Referring to FIGS. 13, 15, and 16, a gate stack GS' according to an example embodiment may have a plurality of channel columns CH disposed in nine columns in an y-axis direction on a cell array region CA, and the channel columns CH may pass through the gate stack GS' in a z-axis direction to extend to a substrate 101. The gate stack GS' may include a stepped structure providing a plurality of pad regions P' on a connection region CT. The stepped structure need not include the second stepped structure illustrated in FIG. 4. The stepped structure may include a plurality of step layers ST', and each of the step layers ST' may include two gate electrode layers having a first gate electrode layer 132a and a second gate electrode layer 132b, and may provide a single pad region P'. To apply an electrical signal to the plurality of first gate electrode layers 132a and second gate electrode layers 132b forming the gate stack GS', the respective first gate electrode layers 132a and the respective second gate electrode layers 132b may have a plurality of contact plugs 271, first contact plugs 271a, and second contact plugs 271b disposed therein to extend in the z-axis direction. The farther the contact plugs 271, the first contact plugs 271a, and the second contact plugs 271b are spaced apart from the cell array region CA, the longer the contact plugs 271, the first contact plugs 271a, and the second contact plugs 271b extending in the z-axis direction are. The contact plugs 271 may be connected to two divided portions of an uppermost electrode layer 133, respectively. The first contact plugs 271a and the second contact plugs 271b may be disposed on the same pad region P', but the first contact plugs 271a may pass through the second gate electrode layers 132b to be connected to the first gate electrode layers 132a, and the second contact plugs 271b may be connected to the second gate electrode layers 132b. Because the first contact plugs 271a may be electrically insulated from the second gate electrode layers 132b, plug insulating layers 273 may be disposed to surround outer circumferential surfaces of the first contact plugs 271a, respectively. The plug insulating layers 273 may also be disposed on outer circumferential surfaces of the second contact plugs 271b, respectively.

In FIG. 13, the first contact plugs 271a and the second contact plugs 271b may be disposed in two columns in the x-axis direction, a single first contact plug 271a may be connected to each of the first gate electrode layers 132a, and a single second contact plug 271b may be connected to each of the second gate electrode layers 132b, on each of the pad regions P', but the first contact plugs 271a and the second contact plugs 271b are not limited thereto. For example, a plurality of first contact plugs 271a may be connected to each of the first gate electrode layers 132a, and a plurality of second contact plugs 271b may be connected to each of the second gate electrode layers 132b, on each of the pad regions P'.

Figure 14:
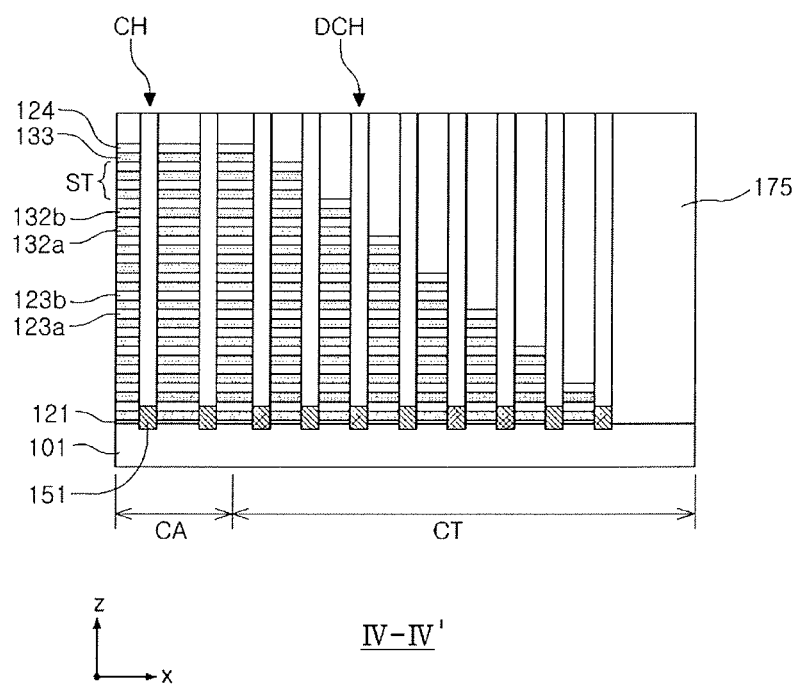
FIGS. 14 through 16 are schematic cross-sectional views of vertical memory devices according to an example embodiment of the present inventive concept, respectively.

FIG. 14 is a cross-sectional view taken along line IV-IV' of FIG. 12. The descriptions of the channel columns CH and the dummy channel columns DCH described with reference to FIGS. 6 and 7 may be applied to FIG. 14 as they are. As described with reference to FIG. 13, FIGS. 13 and 14 differ from each other in that a shape of a stepped structure providing pad regions P' is different from that of the stepped structure illustrated in FIG. 13.

According to an example embodiment, a gate stack GS may have the stepped structure as described above in which each of the step layers ST includes two gate electrode layers on a connection region CT, and a full length L of the stepped structure for providing pad regions may thus be reduced by half, as compared to a conventional stepped structure in which each of step layers ST includes a single gate electrode layer.

In an example embodiment, each of step layers ST forming a stepped structure on a connection region CT may include three gate electrode layers, and may include three contact plugs connected to each of the three gate electrode layers. In such a manner, the stepped structure on the connection region CT may be modified to a structure in which a single step layer ST includes four or more gate electrode layers.

According to example embodiments, the full length L of the first stepped structure for providing the plurality of pad regions on the connection region CT may be significantly reduced, and when the number of gate electrode layers stacked on the substrate 101 is increased so that a full height of the gate stack GS on the cell array region CA may be from about 3.5 μm to about 10 μm, a full length L of the first stepped structure on the connection region CT may be from about 10 μm to about 28 μm. As described above, when such a structural design rule is satisfied, the thickness distribution of the epitaxial layers 151 disposed on the lower portions of the dummy channel columns DCH of FIG. 6 on the connection region CT adjacent to the cell array region CA may be reduced, and the heights of the epitaxial layers 151 of FIG. 6 disposed on the lower portions of the dummy channel columns DCH of FIG. 6 at the end of the connection region CT may be prevented from being lower than the height of the upper surface of the lowermost gate electrode layer 132a.

Figure 18:
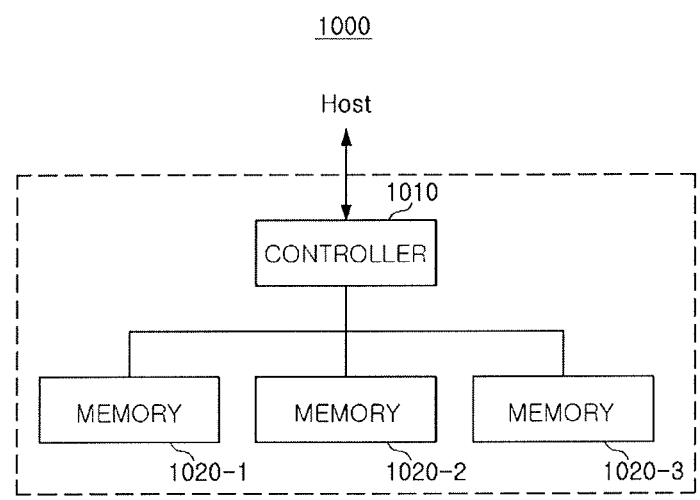
FIG. 18 is a block diagram of a storage device including a vertical memory device according to an example embodiment of the present inventive concept.

FIG. 18 is a block diagram of a storage device including a vertical memory device according to an example embodiment of the present inventive concept.

Referring to FIG. 18, a storage device 1000 according to an example embodiment may include a controller 1010 communicating with a host and memories 1020-1, 1020-2, and 1020-3 storing data. Each of the memories 1020-1, 1020-2, and 1020-3 may include a vertical memory device according to an example embodiment of the present inventive concept as described above.

The host communicating with the controller 1010 may be various types of electronic devices equipped with the storage device 1000, such as a smartphone, a digital camera, a desktop PC, a laptop PC, a portable media player, and the like. The controller 1010 may receive a data write or read request transmitted from the host to generate a command (CMD) for storing or retrieving data to/from the memories 1020-1, 1020-2, and 1020-3.

As illustrated in FIG. 18, at least one of the memories 1020-1, 1020-2, and 1020-3 included in the storage device 1000 may be connected to the controller 1010 in parallel. By connecting the plurality of memories 1020-1, 1020-2, and 1020-3 to the controller 1010 in parallel, the storage device 1000 having a large capacity may be implemented, such as a solid state drive (SSD).

Figure 19:
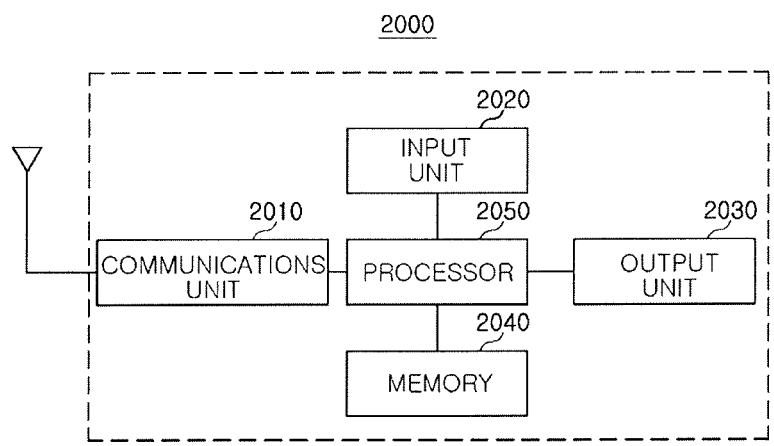
FIG. 19 is a block diagram of an electronic device including a vertical memory device according to an example embodiment of the present inventive concept.

FIG. 19 is a block diagram of an electronic device including a vertical memory device according to an example embodiment of the present inventive concept.

Referring to FIG. 19, an electronic device 2000 according to an example embodiment may include a communication unit 2010, an input unit 2020, an output unit 2030, a memory 2040, and a processor 2050.

The communication unit 2010 may include wire and wireless communications modules such as a wireless Internet module, a local communications module, a global positioning system (GPS) module, a module communications module. The wired/wireless communications module included in the communications unit 2010 may be connected to an external communications network based on various communications standards to transmit and receive data.

The input unit 2020 may include a mechanical switch, a touchscreen, a voice recognition module, and the like, as a module provided for a user to control operations of the electronic device 2000. In addition, the input unit 2020 may also include a mouse or a finger mouse device operating based on a track ball or a laser pointer, and may further include various sensor modules which enable a user to input data.

The output unit 2030 may output information processed by the electronic device 2000 in an audio or video format, and the memory 2040 may store a program for processing or control of the processor 2050, or data. The memory 2040 may include a vertical memory device according to an example embodiment of the present inventive concept as described above. The processor 2050 may send an instruction to the memory 2040 depending on a required operation to store or retrieve data to/from the memory 2040.

The memory 2040 may be embedded in the electronic device 2000, or may communicate with the processor 2050 through an additional interface. When the memory 2040 communicates with the processor 2050 through the additional interface, the processor 2050 may store or retrieve data to/from the memory 2040 through various interface standards such as secure digital (SD), secure digital high capacity (SDHC), secure digital extended capacity (SDXC), micro SD, universal serial bus (USB), etc.

The processor 2050 may control operations of each component included in the electronic device 2000. The processor 2050 may perform control and processing associated with a voice call, a video call, data communications, and the like, or may conduct control and processing for multimedia reproduction and management. The processor 2050 may also process an input entered by a user through the input unit 2020 and output a result thereof through the output unit 2030. Furthermore, the processor 2050 may store or retrieve data required to control operations of the electronic device 2000 to/from the memory 2040 as described above.

Figure 20:
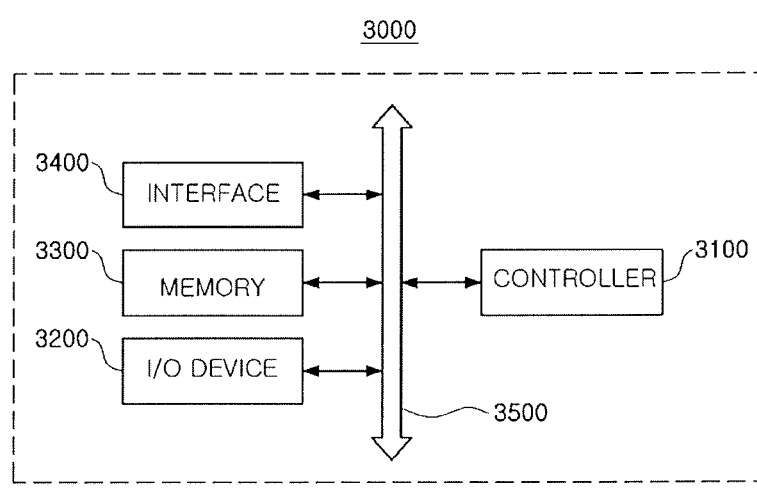
FIG. 20 is a block diagram of an electronic system including a vertical memory device according to an example embodiment of the present inventive concept.

FIG. 20 is a block diagram of an electronic system including a vertical memory device according to an example embodiment of the present inventive concept.

Referring to FIG. 20, an electronic system 3000 may include a controller 3100, an input/output (I/O) device 3200, a memory 3300, and an interface 3400. The electronic system 3000 may be a mobile system or a system that transmits or receives information. The mobile system may be a personal digital assistant (PDA), a portable computer, a tablet PC, a wireless phone, a mobile phone, a digital music player, a memory card, and the like.

The controller 3100 may function to execute a program and control the electronic system 3000. The controller 3100 may be, for example, a microprocessor, a digital signal processor, a microcontroller, or devices similar thereto.

The I/O device 3200 may be used to input or output data of the electronic system 3000. The electronic system 3000 may use the I/O device 3200 to be connected to an external device such as a personal computer or a network, thereby communicating data with the external device. The I/O device 3200 may be, for example, a keypad, a keyboard, or a display.

The memory 3300 may store a code and/or data for operations of the controller 3100, and/or may store data processed by the controller 3100. The memory 3300 may include a vertical memory device according to an example embodiment of the present inventive concept as described above.

The interface 3400 may be a data transfer path between the electronic system 3000 and other external devices. The controller 3100, the I/O device 3200, the memory 3300, and the interface 3400 may communicate with each other using a bus 3500.

At least one of the controller 3100 and the memory 3300 may include at least one of the vertical memory devices described above.

According to example embodiments of the present inventive concept, a memory device may be provided to reduce the thickness distribution of epitaxial layers respectively disposed below dummy channel columns on a connection region adjacent to a cell array region and to also increase reliability thereof.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A vertical memory device comprising:
   a substrate having a cell array region and a connection region adjacent to the cell array region;
   a first gate stack including a plurality of gate electrode layers spaced apart from each other in a first direction perpendicular to the substrate,
   wherein the plurality of gate electrode layers extends from the cell array region to the connection region in a second direction perpendicular to the first direction to form a first stepped structure on the connection region,
   wherein the first stepped structure includes a first gate electrode layer and a second gate electrode layer of the plurality of gate electrode layers sequentially stacked,
   wherein the second gate electrode layer includes a first region having a same length as a length of the first gate electrode layer and a second region having a shorter length than the length of the first gate electrode layer in the second direction,
   wherein a height of the first gate stack on the cell array region is from about 3.5 μm to about 10 μm in the first direction, and
   wherein a distance from an end of an uppermost gate electrode layer among the plurality of gate electrode layers facing away from the cell array region to an end of a bottommost gate electrode layer among the plurality of gate electrode layers facing away from the cell array region is from about 10 μm to about 28 μm in the second direction:
   a plurality of channel columns passing through a first portion of the first gate stack in parallel to the first direction, wherein the first portion of the first gate stack is disposed on the cell array region; and
   a plurality of dummy channel columns adjacent to respective ends of the plurality of gate electrode layers on the connection region and extending in the same direction as a direction of the channel columns.

2. The vertical memory device of claim 1,
   wherein the first stepped structure includes a first pad region including a portion of the first gate electrode layer exposed by the second region of the second gate electrode layer and a second pad region including a portion of the first region of the second gate electrode layer.

3. The vertical memory device of claim 2,
   wherein the first stepped structure includes the first pad region and the second pad region spaced apart from each other in the first direction to form a second stepped structure in a third direction perpendicular to the first direction and the second direction, and
   wherein the first pad region is lower than the second pad region in the first direction.

4. The vertical memory device of claim 3, further comprising:
   a first contact plug disposed on the first pad region and connected to the first gate electrode layer; and
   a second contact plug disposed on the second pad region and connected to the second gate electrode layer.

5. The vertical memory device of claim 1,
   wherein each of the plurality of channel columns and the plurality of dummy channel columns includes an epitaxial layer at a lower portion of the plurality of channel columns and at a lower portion of the plurality of dummy channel columns.

6. The vertical memory device of claim 5,
   wherein an upper surface of each of the plurality of epitaxial layers is higher than an upper surface of a lowermost gate electrode layer among the plurality of gate electrode layers.

7. The vertical memory device of claim 1,
   wherein each of the plurality of channel columns include a gate insulating layer and
   wherein the gate insulating layer includes an electric charge trap layer.

8. The vertical memory device of claim 1,
   wherein each of the plurality of dummy channel columns is further disposed in step layers forming the first stepped structure.

9. The vertical memory device of claim 1,
   wherein the plurality of dummy channel columns are symmetrically disposed in the first gate stack.

10. A vertical memory device comprising:
    a substrate having a cell array region and a connection region adjacent to the cell array region;
    a gate stack including a plurality of gate electrode layers spaced apart from each other in a direction perpendicular to the substrate and extending from the cell array region to the connection region, the plurality of gate electrode layers forming a stepped structure on the connection region,
    wherein a height of the gate stack on the cell array region in the direction perpendicular to the substrate is from 3.5 μm to 10 μm, and an upper surface of the substrate and a virtual line connecting an end of a top gate electrode layer among the plurality of gate electrode layers to an end of a bottom gate electrode layer of the plurality of gate electrode layers form an angle from about 7 degrees to about 45 degrees;
    a channel column penetrating the gate stack in the cell array region; and
    a dummy channel column penetrating a gate electrode layer of the plurality of gate electrode layers in the connection region.

11. A vertical memory device comprising:
    a substrate having a cell array region and a connection region adjacent to the cell array region;
    a first gate stack including a plurality of gate electrode layers spaced apart from each other in a first direction perpendicular to the substrate,
    wherein the plurality of gate electrode layers extends from the cell array region to the connection region in a second direction perpendicular to the first direction to form a first stepped structure on the connection region, wherein the first stepped structure includes a first gate electrode layer and a second gate electrode layer of the plurality of gate electrode layers sequentially stacked, wherein the second gate electrode layer includes a first region having the same length as a length of the first gate electrode layer and a second region having a shorter length than the length of the first gate electrode layer in the second direction, wherein the ratio of a distance from an end of an uppermost gate electrode layer among the plurality of gate electrode layers facing away from the cell array region to an end of a bottommost gate electrode layer among the plurality of gate electrode layers facing away from the cell array region in the second direction to a height of the first gate stack on the cell array region in the direction perpendicular to the substrate is between 1:1 and 8:1 (1≤the distance/the height≤8);

a plurality of channel columns passing through a first portion of the first gate stack in parallel to the first direction, wherein the first portion of the first gate stack is disposed on the cell array region; and a plurality of dummy channel columns adjacent to respective ends of the plurality of gate electrode layers on the connection region and extending in the same direction as a direction of the channel columns.

12. The vertical memory device of claim 11, wherein the first stepped structure includes a first pad region including a portion of the first gate electrode layer exposed by the second region of the second gate electrode layer and a second pad region including a portion of the first region of the second gate electrode layer.

13. The vertical memory device of claim 12, wherein the first stepped structure includes the first pad region and the second pad region spaced apart from each other in the first direction to form a second stepped structure in a third direction perpendicular to the first direction and the second direction, and wherein the first pad region is lower than the second pad region in the first direction.

14. The vertical memory device of claim 13, further comprising:

a first contact plug disposed on the first pad region and connected to the first gate electrode layer; and a second contact plug disposed on the second pad region and connected to the second gate electrode layer.

15. The vertical memory device of claim 11, wherein each of the plurality of channel columns and the plurality of dummy channel columns includes an epitaxial layer at a lower portion of the plurality of channel columns and at a lower portion of the plurality of dummy channel columns.

16. The vertical memory device of claim 15, wherein an upper surface of each of the plurality of epitaxial layers is higher than an upper surface of a lowermost gate electrode layer among the plurality of gate electrode layers.

17. The vertical memory device of claim 11, wherein each of the plurality of channel columns include a gate insulating layer and wherein the gate insulating layer includes an electric charge trap layer.

18. The vertical memory device of claim 10, wherein the channel column penetrates an upper portion of the substrate.

19. The vertical memory device of claim 18, wherein the dummy channel column penetrates the upper portion of the substrate.

* * * * *